(12) United States Patent
Mohammed

(10) Patent No.: US 7,605,479 B2
(45) Date of Patent: Oct. 20, 2009

(54) STACKED CHIP ASSEMBLY WITH ENCAPSULANT LAYER

(75) Inventor: Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/487,482

(22) PCT Filed: Aug. 22, 2002

(86) PCT No.: PCT/US02/26805

§ 371 (c)(1), (2), (4) Date: Sep. 17, 2004

(87) PCT Pub. No.: WO03/019654

PCT Pub. Date: Mar. 6, 2003

(65) Prior Publication Data

US 2005/0035440 A1 Feb. 17, 2005

Related U.S. Application Data

(60) Provisional application No. 60/314,042, filed on Aug. 22, 2001.

(51) Int. Cl.
H01L 23/48 (2006.01)
(52) U.S. Cl. .................. 257/778; 257/779; 257/777; 257/780; 257/781; 257/E21.503
(58) Field of Classification Search .............. 257/777, 257/778–790, 735–737, E21.503
See application file for complete search history.

(56) References Cited

U.S. PATENT DOCUMENTS

| | | | |
|---|---|---|---|
| 4,604,644 A * | 8/1986 | Beckham et al. ............ 257/737 |
| 5,148,266 A | 9/1992 | Khandros et al. | |
| 5,438,224 A * | 8/1995 | Papageorge et al. ......... 257/777 |
| 5,518,964 A | 5/1996 | DiStefano et al. | |
| 5,536,909 A | 7/1996 | DiStefano et al. | |
| 5,659,952 A * | 8/1997 | Kovac et al. .................. 29/840 |
| 5,787,581 A | 8/1998 | DiStefano et al. | |
| 5,831,836 A * | 11/1998 | Long et al. .................. 361/820 |
| 5,977,618 A | 11/1999 | DiStefano et al. | |
| 6,121,676 A | 9/2000 | Solberg | |
| 6,157,080 A * | 12/2000 | Tamaki et al. ............... 257/738 |

(Continued)

FOREIGN PATENT DOCUMENTS

JP 62-226307 3/1989

*Primary Examiner*—Thanh V Pham
*Assistant Examiner*—Mohammad T Karimy
(74) *Attorney, Agent, or Firm*—Lerner, David, Littenberg, Krumholz & Mentlik, LLP

(57) ABSTRACT

A microelectronic subassembly 210 includes a substrate 215 having a top surface 216 and at least one peripheral region 219, a microelectronic element 201 mounted over the substrate 215, a plurality of leads 218, 222 electrically connected to the microelectronic element 201 having outer ends overlying the at least one peripheral region 219 of the substrate 215, and vertical conductors 208 electrically connected with the outer ends of the leads. The subassembly includes an encapsulant layer 204 provided over the top surface 216 of the substrate 215 and around the microelectronic element 201 and the vertical conductors 208 for stiffening the substrate 215 at the at least one peripheral region 219 of the substrate for facilitating handling and testing of the subassembly.

36 Claims, 9 Drawing Sheets

U.S. PATENT DOCUMENTS

| | | | |
|---|---|---|---|
| 6,225,688 B1 | 5/2001 | Kim et al. | |
| 6,303,997 B1 * | 10/2001 | Lee | 257/778 |
| 6,313,528 B1 * | 11/2001 | Solberg | 257/723 |
| 6,316,838 B1 * | 11/2001 | Ozawa et al. | 257/778 |
| 6,388,333 B1 * | 5/2002 | Taniguchi et al. | 257/777 |
| 6,531,784 B1 * | 3/2003 | Shim et al. | 257/777 |
| 6,630,730 B2 * | 10/2003 | Grigg | 257/684 |
| 6,699,730 B2 | 3/2004 | Kim et al. | |
| 6,746,894 B2 * | 6/2004 | Fee et al. | 438/106 |
| 6,762,078 B2 * | 7/2004 | Shin et al. | 438/123 |
| 6,774,473 B1 * | 8/2004 | Shen | 257/686 |
| 6,777,787 B2 * | 8/2004 | Shibata | 257/666 |
| 6,844,619 B2 * | 1/2005 | Tago | 257/686 |
| 6,867,499 B1 * | 3/2005 | Tabrizi | 257/777 |
| 2001/0028114 A1 * | 10/2001 | Hosomi | 257/778 |

\* cited by examiner

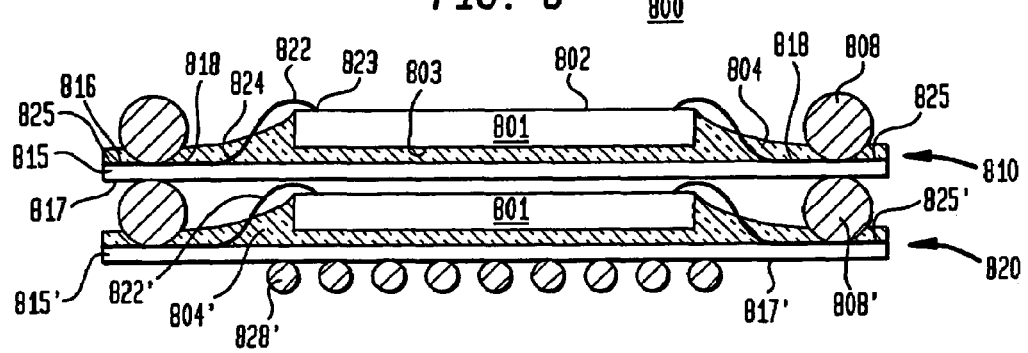
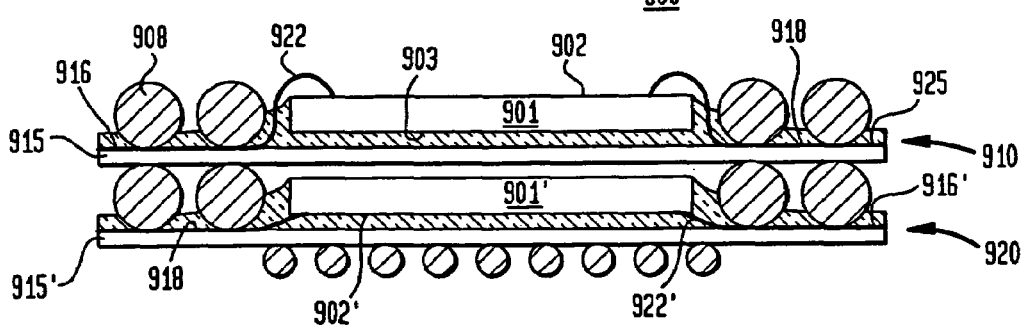
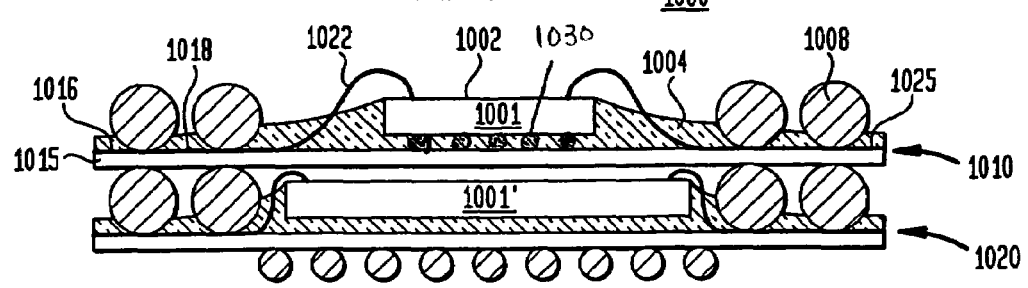

STACKED CHIP ASSEMBLY WITH ENCAPSULANT LAYER

The present application is a national phase entry under 35 U.S.C. §371 of International Application PCT/US02/26805, filed Aug. 22, 2002, published in English, which claims benefit of U.S. Provisional Patent Application 60/314,042 filed Aug. 22, 2001. The disclosures of all of said applications are incorporated by reference herein.

TECHNICAL FIELD

The present invention generally relates to stacked microelectronic assemblies, and more particularly relates to stacked microelectronic assemblies having a stiffening layer.

BACKGROUND ART

In certain preferred embodiments of commonly assigned U.S. Pat. No. 5,861,666, the disclosure of which is hereby incorporated by reference herein, a stacked microelectronic assembly includes a plurality of chip and interposer subassemblies. Each subassembly has a circuitized interposer and a semiconductor chip, one face of which confronts a surface of the interposer. Each interposer has at least one peripheral region projecting laterally beyond an edge of the chip mounted to the interposer. Each interposer also includes a plurality of leads electrically connected to contacts on the chip face that extend to the peripheral region of the interposer. The subassemblies are stacked one atop another in a generally vertical configuration so that the chips overlie one another and so that the projecting portions of the interposers overlie one another. The subassemblies are electrically connected one to another by vertical conductors extending alongside the chips and interconnecting the leads of the various interposers at their peripheral regions.

FIG. 1A shows a microelectronic assembly 100 disclosed in U.S. Pat. No. 5,861,666 made from a number N of prefabricated subassemblies, comprising N−1 subassemblies 110 and base subassembly 120. Subassembly 110 comprises a semiconductor chip 101 having opposed surfaces 102 and 103, one surface having exposed electrical contacts (not shown), and an interposer 115 having a first surface 116 and a second surface 117. Interposer 115 is preferably a flexible sheet-like element. Chip 101 is mounted on first surface 116 of interposer 115 and the contacts are electrically connected to conductors (not shown) on a surface of interposer 115. Fan-out connectors 111, such as high-melting temperature solder balls, are affixed to the second surface 117 of the interposer 115 (the side opposite chip 101). In each subassembly 110, the electrical connections between chip 101 and interposer 115 are encapsulated in a material 104 such as an epoxy or elastomer, which fills the gaps between chip 101 and surface 116 and partially surrounds the chip. The base subassembly 120 comprises an encapsulated microelectronic element 101, encapsulant 104 and interposer 125 similar to those described above for subassembly 110. A plurality of joining units 121 are affixed to second surface 127 (the side opposite from microelectronic element 101) of interposer 125. Base subassembly 120 is adapted to serve as the bottom-most unit of stack 100 and may be affixed directly to an external element such as a printed circuit board or a second microelectronic assembly.

When subassemblies 110 and 120 are stacked, fan-out connectors 111 electrically interconnect the subassemblies within the stack, thereby acting as vertical conductors. To allow stacking, fan-out connectors 111 of each subassembly 110 must be positioned outside of the region of interposer 115 of the next lower subassembly occupied by chip 101 and encapsulant 104. Typically, this requirement results in fan-out connectors 111 of each subassembly 110 being disposed in a peripheral region of interposer 115 which is not covered by encapsulant 104 on first surface 116. This peripheral region, therefore, remains quite flexible, which may lead to difficulties in handling the subassemblies and in bonding the fan-out connectors when the subassemblies are stacked. The subassemblies can be made more rigid by dispensing additional encapsulant as shown in FIG. 2A. Increasing the area covered by encapsulant reduces the area available for the fan-out connectors, thereby decreasing the number of rows of connectors that may be used and resulting in poor utilization of the interposer. The problems arising from excessive flexing of the peripheral regions are even more pronounced where multiple rows of fan-out connectors or joining units are employed (FIG. 2B) and where a differently sized die is used in the upper subassemblies (FIG. 2C).

In spite of the advances set forth in U.S. Pat. No. 5,861,666, there remains a need for a stackable microelectronic subassembly that is easily handled and tested during making of a stacked microelectronic assembly. There also remains a need for a stackable microelectronic subassembly having a stiffening layer for stiffening peripheral regions of the subassembly. The present invention addresses these needs.

SUMMARY OF THE INVENTION

In accordance with certain preferred embodiments of the present invention, a microelectronic subassembly includes a substrate, such as a flexible dielectric substrate, having a top surface and at least one peripheral region, a microelectronic element mounted over the substrate, and a plurality of leads electrically connected to the microelectronic element having outer ends overlying the at least one peripheral region of the substrate. The subassembly also desirably includes vertical conductors, such as solder balls, electrically connected with the outer ends of the leads, and an encapsulant layer provided over the top surface of the substrate and around the microelectronic element and the vertical conductors for stiffening the substrate at the at least one peripheral region of the substrate. In certain embodiments, the substrate may be a flexible substrate made of a polymeric material.

In certain preferred embodiments, the microelectronic element is a semiconductor chip having a front face with contacts and a back face remote therefrom. The semiconductor chip may be assembled with the substrate so that the front face of the semiconductor chip faces the top surface of the substrate with the leads connected to the chip contacts. In other preferred embodiments, the semiconductor chip may be assembled with the substrate so that the back face of the semiconductor chip confronts the top surface of the substrate and the front face faces away from the substrate. In this particular embodiment, the subassembly may include conductive wires having first ends connected to the chip contacts and second ends connected to the leads.

The subassembly also preferably includes a compliant layer disposed between the microelectronic element and the substrate so as to permit relative movement of the microelectronic element and the substrate during thermal cycling of the subassembly. The compliant layer may include a plurality of compliant pads spaced from one another for defining channels or gaps therebetween. The stiffening encapsulant layer may be disposed in the channels between the compliant pads.

The stiffening encapsulant layer is preferably selected from the group consisting of flexibilized epoxies, silicone elastomers, glass sheet, glass-filled epoxies, ceramic materials and plastics. Although the present invention is not limited by any particular theory of operation, it is believed that providing a stiffening layer that surrounds the vertical conductors in the peripheral region of the substrate will enhance handling and testability of the subassembly by providing sufficient stiffness in the peripheral region of the subassembly. Absent the stiffener layer, the peripheral region of the substrate may flex, bend or flop to an undesirable degree during testing and handling.

In certain preferred embodiments, the substrate includes a plurality of dielectric layers, and a plurality of layers of conductive traces extending through the substrate. The substrate may also include a conductive metal layer adapted to function as a power plane. In yet other preferred embodiments, the substrate may also include a conductive metal layer adapted to function as a ground plane.

In other preferred embodiments of the present invention, a microelectronic subassembly includes a substrate having a top surface, a bottom surface and at least one peripheral region, a microelectronic element mounted over the top surface of the substrate, and a plurality of leads electrically connected to the microelectronic element, the leads having outer ends overlying the at least one peripheral region of the substrate. The microelectronic subassembly also preferably includes vertical conductors electrically connected with the outer ends of the leads, and an encapsulant layer provided over one of the surfaces of the substrate and around the vertical conductors for stiffening the at least one peripheral region of the substrate. In certain preferred embodiments, the vertical conductors are disposed over the bottom surface of the substrate and the stiffening encapsulant layer is provided over the bottom surface of the substrate and around the vertical conductors.

In yet further preferred embodiments of the present invention, a microelectronic assembly includes a plurality of microelectronic subassemblies, each subassembly having a substrate with at least one peripheral region, a microelectronic element mounted over the substrate, a plurality of leads electrically connected to the microelectronic element having outer ends overlying the at least one peripheral region of the substrate, vertical conductors electrically connected with the outer ends of the leads, and an encapsulant layer provided over a surface of the substrate and around the vertical conductors for stiffening the substrate at the least one peripheral region of the substrate. The microelectronic subassemblies are stacked one atop another and electrically interconnected through the vertical conductors. The vertical conductors preferably form electrical interconnections between leads of different subassemblies. The vertical conductors preferably include metallic masses, such as solder balls. The microelectronic elements of the assembly may vary in size.

In certain preferred embodiments, each of the substrates has a central region aligned with the microelectronic element mounted thereto and a plurality of peripheral regions extending outwardly at a plurality of edges of the substrate.

These and other preferred embodiments of the present invention will be described in more detail below.

BRIEF DESCRIPTION OF THE DRAWINGS

FIG. 8 shows a stacked microelectronic assembly with one or more stiffening layers, in accordance with other preferred embodiments of the present invention.

FIG. 9 shows a stacked microelectronic assembly with one or more stiffening layers, in accordance with still other preferred embodiments of the present invention.

FIG. 10 shows a stacked microelectronic assembly with stiffening layers, in accordance with still further preferred embodiments of the present invention.

BEST MODE OF CARRYING OUT INVENTION

Figure 1A:
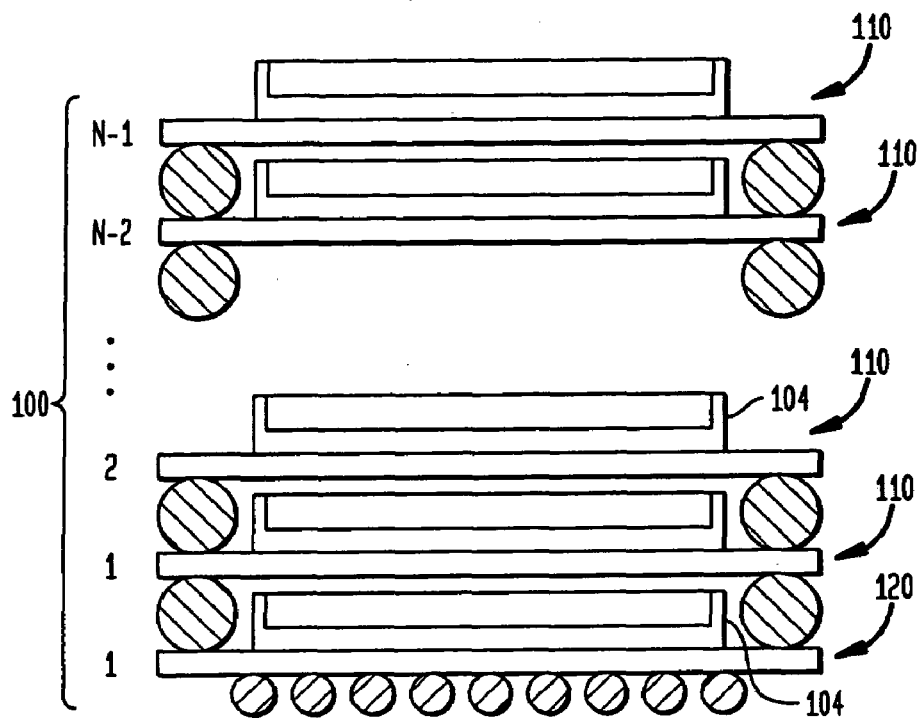
FIG. 1A shows a conventional stacked microelectronic assembly.
Figure 1B:
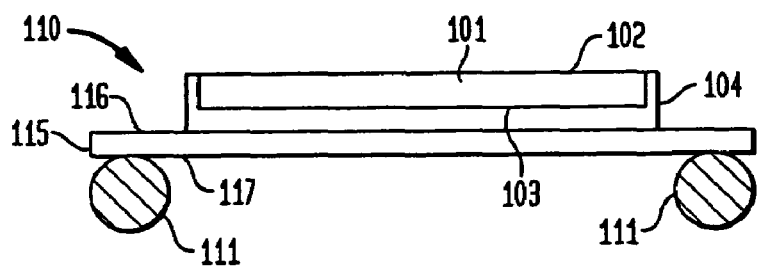
FIG. 1B shows an upper layer of the stacked microelectronic assembly of FIG. 1A.
Figure 1C:
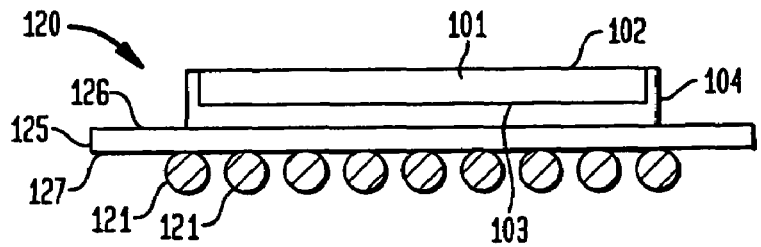
FIG. 1C shows a base layer of the stacked microelectronic assembly of FIG. 1A.
Figure 2A:
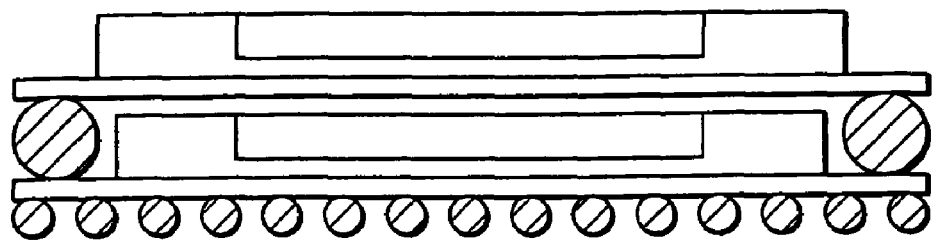
FIG. 2A shows another conventional stacked microelectronic assembly.
Figure 2B:
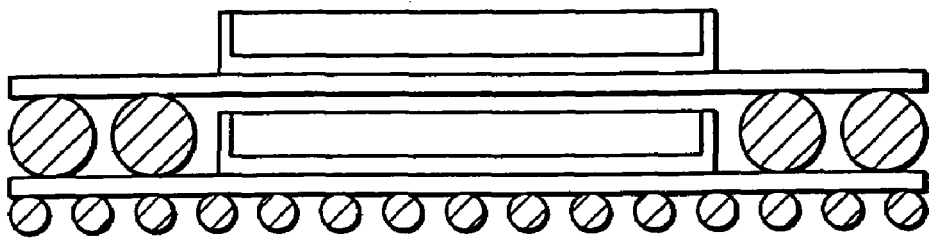
FIG. 2B shows still another conventional stacked microelectronic assembly.
Figure 2C:
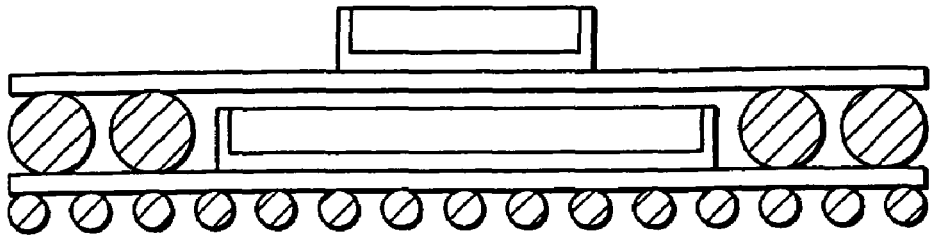
FIG. 2C shows yet another conventional stacked microelectronic assembly.
Figure 3A:
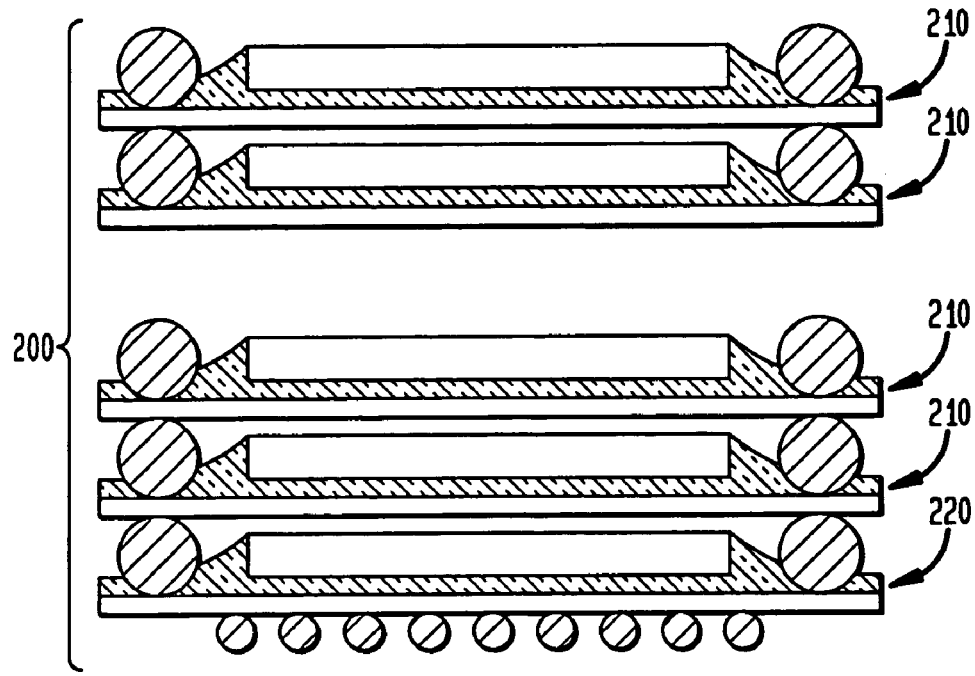
FIG. 3A shows a stacked microelectronic assembly including stiffening layers, in accordance with certain preferred embodiments of the present invention.
Figure 3B:
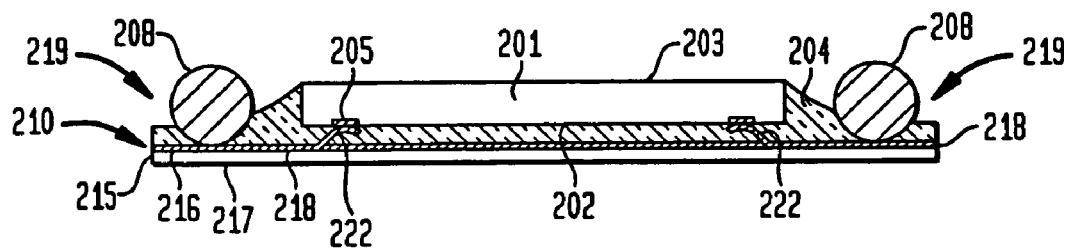
FIG. 3B shows an upper layer of the stacked microelectronic assembly of FIG. 3A.
Figure 3C:
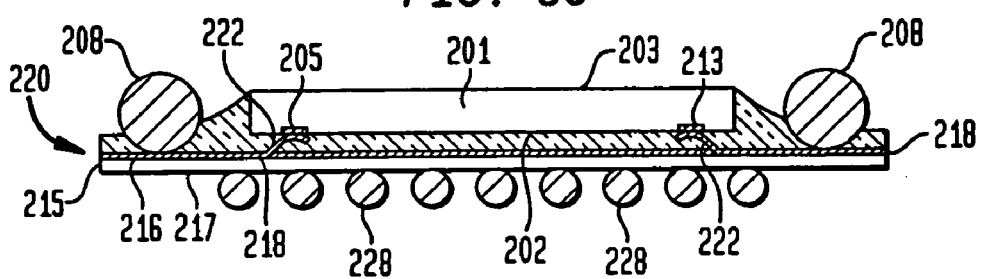
FIG. 3C shows a base layer of the stacked microelectronic assembly of FIG. 3A.

FIG. 3A illustrates a preferred embodiment of the stacked assembly of the present invention. Stacked assembly 200 includes a plurality of N−1 subassemblies 210 stacked one atop another with a base subassembly 220 occupying the bottom-most position in the stack. Referring to FIGS. 3B and 3C, each subassembly 210, 220 includes a microelectronic element 201, such as a semiconductor chip, having a front face 202, a back face 203 opposite front face 202 and a plurality of contacts 205 exposed at front face 202. Preferably, contacts 205 are exposed in a peripheral region of the chip face. Interposer 215 is desirably a dielectric element having a first surface 216, a second surface 217 opposite first surface 216 and a plurality of conductive pads (not shown) disposed on first surface 216. Interposer 215 also preferably has conductive elements 218 such as metallic traces thereon, with contacts 205 of chip 201 being electrically connected to conductive elements 218. Preferably, interposer 215 is made of a flexible dielectric material such as polyimide tape. Interposer 215 may also include one or more additional layers such as a conductive metal layer to serve as a power or ground plane, multiple layers of traces and multiple dielectric layers.

Referring to FIGS. 3B and 3C, the electrical connection between the contacts on face surface 202 and the pads on first surface 216 may be made by any of the known methods of making electrical connections including, but not limited to, flip-chip bonding, wire bonding, tab bonding and the bonding methods disclosed in commonly assigned U.S. Pat. Nos. 5,148,265; 5,148,266; 5,518,964 and 5,536,909, the disclosures of which are incorporated herein by reference. Preferably, at least one pad is movable with respect to at least one contact. The preferred embodiments of the present invention are not limited to the illustrated flip-chip configuration where face surface 202 faces first surface 216 of interposer 215. The present invention also contemplates "face-up" configurations, wherein a face surface 202 of a chip faces away from interposer 215. The utilization of lead-bonding methodologies disclosed in the U.S. Patents cited above are preferred because the resulting lead structures allow the formation of subassemblies having a very low overall height.

Referring to FIGS. 3B and 3C, fan-out connectors 208, such as high-melting solder balls, are disposed on first surface 216 of interposer 215 and are electrically connected to at least some of conductive elements 218 on first surface 216. Fan-out connectors 208 are located so that, when subassemblies 210, 220 are stacked one atop another, fan-out connectors 208 electrically interconnect the subassemblies within the stack, acting as vertical conductors. Fan-out connectors 208 are preferably located around outer edges of chip 201 and adjacent peripheral regions of interposer 215.

Subassemblies 210, 220 also include respective stiffening layers 204. Each stiffening layer 204 is preferably made of an encapsulating material, such as a flexibilized epoxy or silicone elastomer, which surrounds both microelectronic element 201 and fan-out connectors 208. The encapsulant also desirably encapsulates the leads or other bonding structures 222 connecting contacts 205 of chip 201 to the conductive elements of interposer 215.

Referring to FIG. 3C, subassembly 220 also preferably includes joining units 228 that are disposed on second surface 217 of interposer 215 and electrically connected to at least some of the pads on first surface 216. Joining units 228 may be used to attach assembly 200 to electrical contacts or pads on an external electronic element, such as those on a printed circuit board, or a second microelectronic assembly.

Figure 4A:
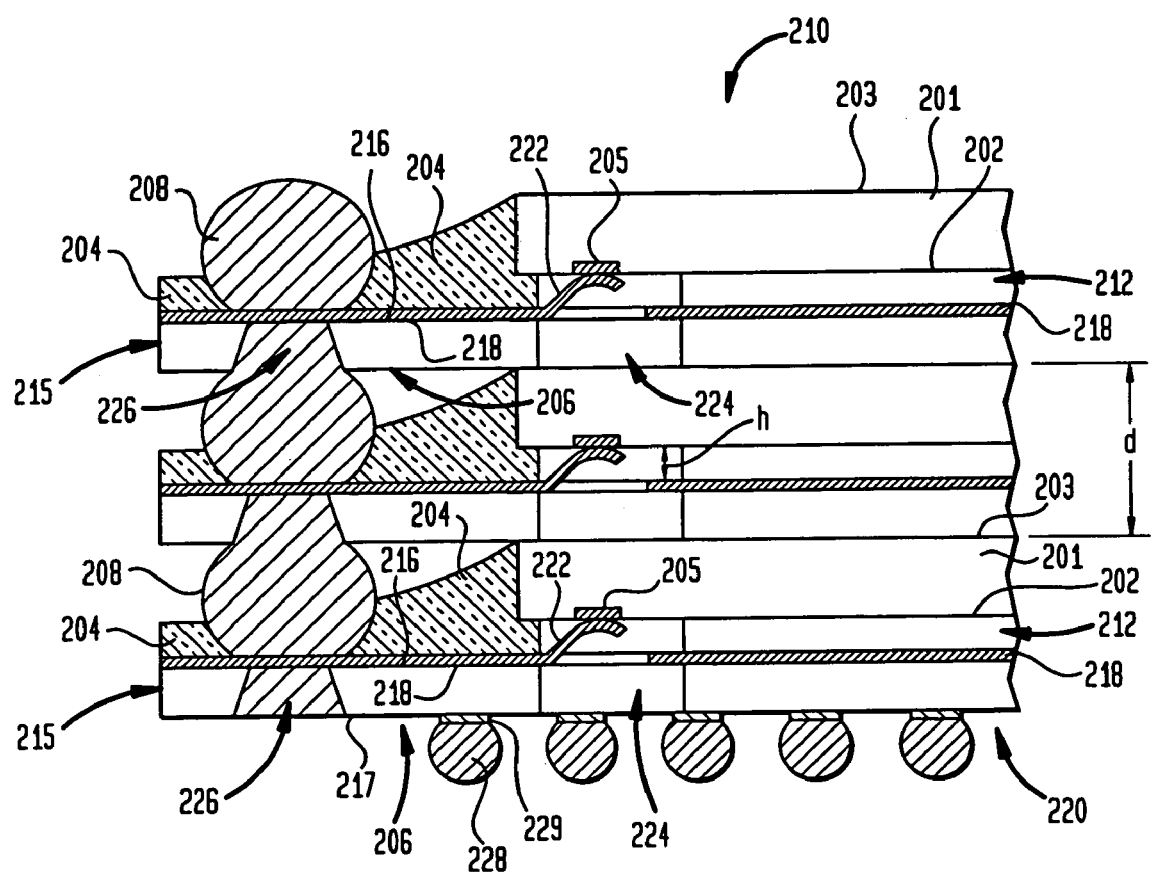
FIG. 4A shows an enlarged fragmentary view of the stacked microelectronic assembly of FIG. 3A.
Figure 4B:
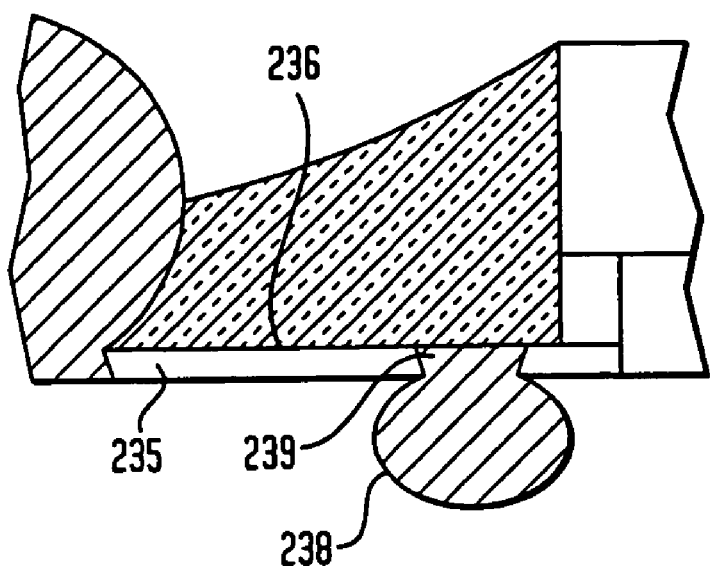
FIG. 4B shows another enlarged fragmentary view of FIG. 4A in accordance with certain preferred embodiments of the present invention.

As illustrated in FIG. 4A, a joining unit may be formed by attaching a eutectic solder ball 228 to a conductive pad 229 affixed to second surface 217 of interposer 215. Preferably, peripheral region 206 of interposer 215 is penetrated by vias 226. Vias 226 may be open at both ends or closed at one end to accommodate various methods of making electrical connections, as are known in the art. Vias 226 may be electrically conductive. Referring to FIG. 4B, in certain preferred embodiments, interposer 235 is formed with openings 239 therein, and solder mass 239 is allowed to flow into an opening 238 to establish electrical contact with first surface 236. The embodiment of FIG. 4B allows interposer 235 to be constructed with a single metallic tape at a substantially lower cost than the embodiment of FIG. 4A, for which a bimetallic tape would more typically be employed.

Referring to FIG. 4A, each subassembly preferably includes fan-out connectors 208, such as high-temperature solder balls, bonded to conductive elements 218. The diameter of each connector 208 is greater than the combined thicknesses of compliant layer 212 and microelectronic element 201 so that fan-out connector 208 extends beyond chip 201 to contact via 226 of the subassembly above it. Preferably, back surface 203 of chip 201 is in close proximity to second surface 217 of its adjacent subassembly. A layer 212 of compliant material such as a gel or an elastomer is disposed between front face 202 of each chip 201 and surface 216 of interposer 215. Thus, interposer 215 of each subassembly 210, 220 is mechanically decoupled from chip 201 and free to deform and deflect independent of the chip. Fan-out connectors 208 may be provided as conventional "solid-core solder balls", initially having coatings of solder which reflow to bond the connectors 208 to vias 226 and, preferably, to contact conductive elements 218.

Referring to FIG. 4A, stiffening layer 204 is provided over top surface 216, preferably surrounding microelectronic element 201 and fan-out connector 208. Preferably, stiffening layer 204 is formed of an encapsulant, more preferably, of a flexibilized epoxy or silicone elastomer. In certain preferred embodiments, the encapsulant of interposer 215 fills gaps between the front face 202 of chip 201 and top surface 216 of interposer 215, and encapsulates leads 222.

Figure 4C:
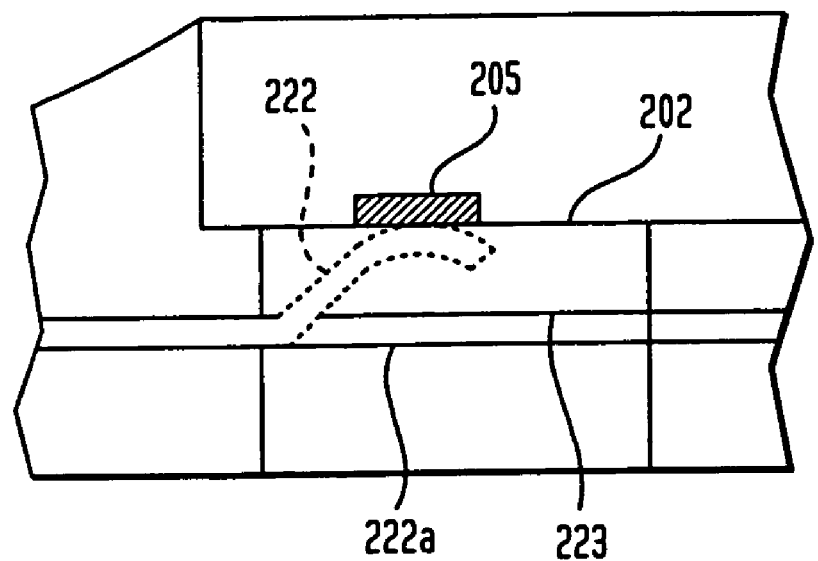
FIG. 4C shows still another enlarged fragmentary view of FIG. 4A.

Referring to FIGS. 4A and 4C, microelectronic element 201 is mounted to surface 206 of interposer 215 in a "face-down" arrangement, that is, where the face surface 202 of element 201 confronts surface 206. Leads 222 electrically connect conductive elements 218 to contacts 205. In preferred embodiments, leads 222 are flexible leads, preferably formed of copper, gold, alloys thereof and combinations thereof. For example, leads 222 may be formed according to the methods disclosed in commonly assigned U.S. Pat. Nos. 5,148,265; 5,148,266; 5,787,581 and 5,977,618. Referring to FIG. 4C, lead 222a initially extends over slot 224. Lead 222a may have a notch or other weakened portion that provides a fracture point 223 in the lead. A tool may be inserted into slot 224 to break lead 222a and push it to the position of lead 222, making contact with a contact 205 on chip face 202.

The embodiment of FIG. 4A can readily be modified for "face-up" configurations, that is, the contact-bearing face of the chip faces away from interposer 215, and that contacts 205 can be electrically connected to terminals on a surface of interposer 215 by wire bonding, flip-chip bonding, tab bonding, or other means of electrical bonding presently known in the art. Moreover, it will be obvious to those skilled in the art that an interposer may be fabricated without a conductive element 218 and that lead 222 may be fabricated so as to electrically connect a terminal on a surface of the interposer to a contact on chip face 202.

Referring to FIG. 4A, each subassembly 210, 220 preferably includes a spacer layer 212 disposed between front face 202 of microelectronic element 201 and interposer 215. Spacer layer 212 is preferably compliant. Preferred materials for the spacer layers 212 include epoxies and silicones, with flexibilized epoxies and silicone elastomers being particularly preferred. Spacer layer 212 may comprise a single pad of material, as depicted in FIG. 4A, or a plurality of such pads. The spacer layer 212 absorbs the stress of differential thermal expansion of interposer 215 and the microelectronic element 201 and inhibits deformation of the flexible dielectric structure during handling and installation of the subassembly. Spacer layer 212 is preferably positioned to avoid obstructing movement of flexible leads 222 or interfering with contact between lead 222 and electrical contact 205. In another preferred embodiment of the invention, only the base subassembly 220 of the stacked microelectronic assembly is provided with a compliant spacer layer 212, as the effects of differential thermal expansion typically are most critical at the bottom-most subassembly in the stack.

Referring to FIG. 4A, the individual subassemblies 210, 220 are fabricated as described above. Each subassembly 210, 220 may be tested separately by engaging vias 226 with contacts of a test socket, or by engaging fan-out connector 208 in a socket. The chip 201, leads 222 and connections can then be tested by actual operation of the chip. After testing, the individual subassemblies 210, 220 are stacked one atop another so that chips 201 generally overlie one another in front face to rear face disposition, and so that peripheral regions 206 of the various interposers 215 are aligned with one another. In this arrangement, vias 226 of the various interposers 215 and the fan-out connectors 208 associated therewith are also aligned one with another. Thus, the connector 208 associated with its respective via 226 on one interposer makes contact with a corresponding via 226 on the next interposer in the stack.

Referring to FIG. 4A, joining units 228, such as solder balls, are disposed on second surface 217 of the bottom-most interposer 215 and are electrically connected to at least some conductive elements 218 on first surface 216. Joining units 228 may be used to attach the stacked microelectronic assembly to electrical circuit contacts or pads on a printed circuit board or a second microelectronic assembly.

Figure 6A:
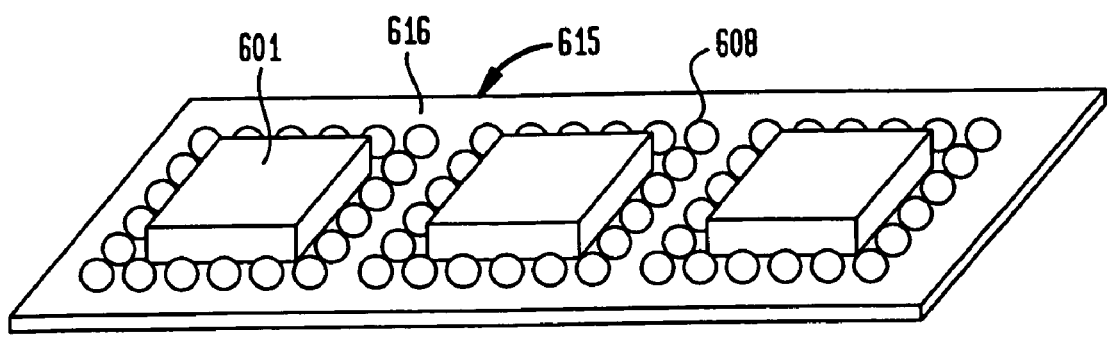
FIGS. 6A and 6B show perspective views of a stacked microelectronic assembly with stiffening layers during various phases of the assembly process, in accordance with certain preferred embodiments of the present invention.
Figure 6B:
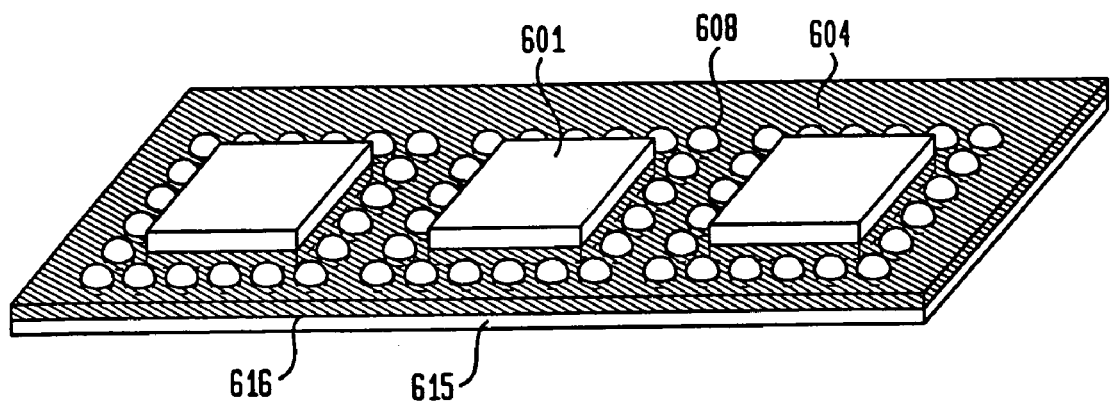

Referring to FIG. 6A, microelectronic elements 601 are attached to a strip of interposer 615 and electrically connected to the interposer as described herein, and fan-out connectors 608 are affixed to surface 616 of interposer 615 as described herein. Referring to FIG. 6B, an encapsulant, such as a flexibilized epoxy or silicone elastomer, is provided over top surface 616 of interposer 615 to surround microelectronic element 601 and fan-out connectors 608.

Figure 7A:
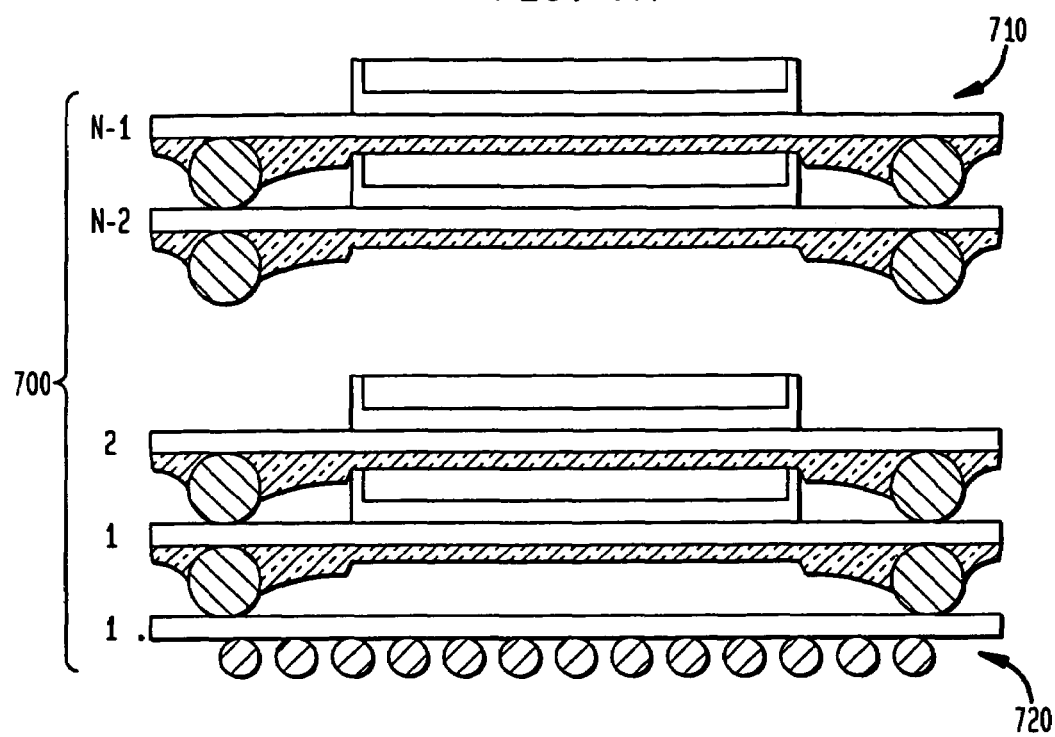
FIG. 7A shows a stacked microelectronic assembly with one or more stiffening layers, in accordance with still other preferred embodiments of the present invention.
Figure 7B:
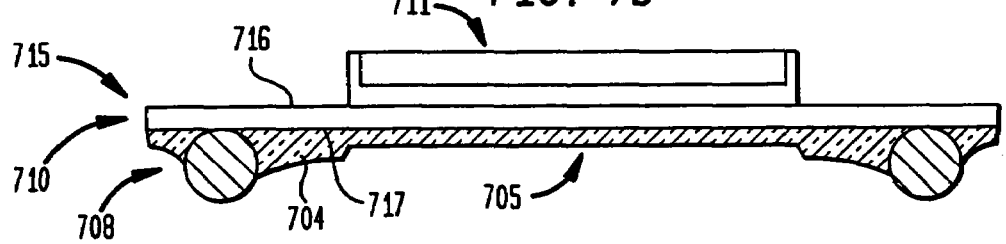
FIG. 7B shows an upper subassembly layer of the stacked microelectronic assembly of FIG. 7A.
Figure 7C:
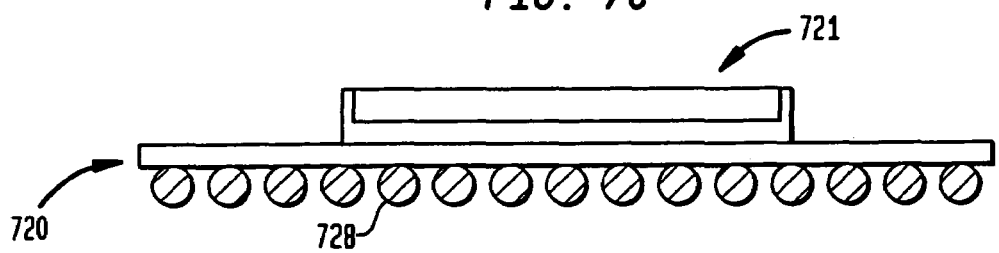
FIG. 7C shows a base layer of the stacked microelectronic assembly of FIG. 7A.

Referring to FIGS. 7A-7C, fan-out connectors 708 are affixed to second surface 717 of interposer 715. Stiffening layer 704 is joined to second surface 717 so as to surround fan-out connectors 708. Stiffening layer 704 includes a depression or opening 705 formed therein so that when subassemblies 710, 720 are stacked one atop another, the respective encapsulated chip 711, 721 of the lower subassembly 711, 721 fits within the opening 705 of the upper assembly. In the embodiment shown, the bottom subassembly 720 in the stack 700 is fabricated without fan-out connectors. Subassembly 720 may be provided with joining units 728 of the types discussed herein for other embodiments of the present invention.

Although FIGS. 3A, 4A and 7A depict embodiments wherein the centers of the microelectronic elements are aligned with each other, the present invention also includes embodiments wherein at least one microelectronic element overlies other microelectronic elements in such a way that the centers of such elements are not aligned. Moreover, the microelectronic elements of the present invention are not limited to single semiconductor chips. Alternatively, a plurality of semiconductor chips may be laid side by side along the first surface of the interposer or stacked one atop another within a subassembly without departing from the invention herein disclosed.

In still other preferred embodiments, other electrically conductive elements may be utilized for creating vertical electrical connections between the subassemblies within a stack. For example, referring to FIG. 4A, vias 226 may serve as fan-out connectors in embodiments where electrically conductive vias 226 are aligned one with another, with an electrically conductive rod inserted through the aligned vias 226 to provide the electrical interconnection between the subassemblies. Alternatively, other methods of establishing vertical electrical connections, such as those disclosed in commonly assigned U.S. Pat. No. 5,861,666, may be used without departing from the scope of the invention. In all such embodiments, stiffening layer 204 would be modified as needed to allow electrical connections to be formed according to the connection method used.

The stiffening layer 204 may be may be formed from materials other than the encapsulants discussed herein. For example, suitable materials include, but are not limited to, glass sheet, glass-filled epoxy, ceramic materials, or a plastic sheet, so long as the stiffening layer surrounds the microelectronic elements in the central region of the interposer and the fan-out connectors in the peripheral regions of the interposer. Alternatively, the stiffening layer may be formed from epoxy or elastomer materials that have a modulus different from the modulus of the materials used to encapsulate leads 222 or to form compliant layer 212.

Figure 5A:
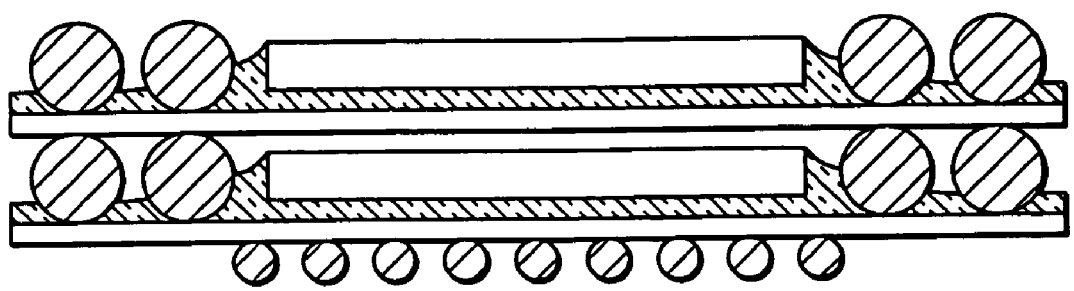
FIG. 5A shows a stacked microelectronic assembly with stiffening layers, in accordance with yet other preferred embodiments of the present invention.
Figure 5B:
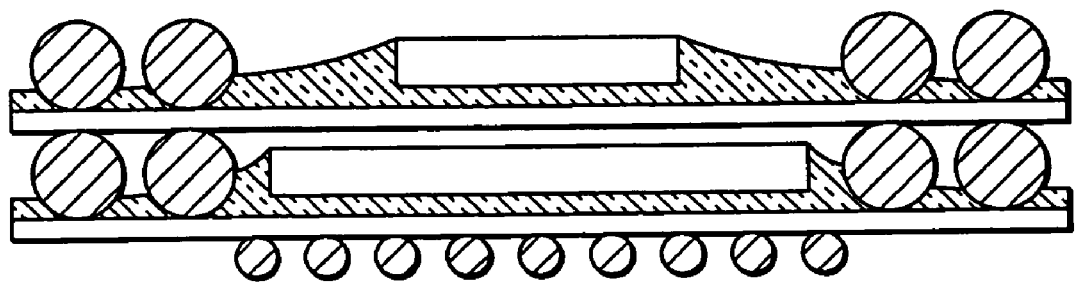
FIG. 5B shows a stacked microelectronic assembly with stiffening layers, in accordance with further preferred embodiments of the present invention.

Although the present invention is not limited by any particular theory of operation, it is believed that providing a stiffening layer on the interposer surface creates a subassembly that is more rigid than those fabricated by methods currently in use, but which still provides some flexibility in the subassembly design. A stiffening layer that surrounds the microelectronic element and/or fan-out connectors further increases the rigidity of the resulting structure. The methods of the present invention may be used to fabricate subassemblies with single or multiple rows of overhung fan-out connectors such as the embodiment of FIG. 5A, or with dies of differing sizes, such as the embodiment of FIG. 5B.

Referring to FIGS. 3B and 3C, each subassembly 210, 220 preferably has a height or thickness that is about 1 millimeter or less. In more preferred embodiments, the subassembly has a thickness of about 700 microns or less. The preferred lead structures, such as leads 222, have a height of 500 microns or less. Such vertically extensive leads allow the contacts on the chip face to move relative to the pads on the first surface of the dielectric element in response to differences in thermal expansion among the elements of the assembly. The stiffening layer 204 provides the desired stiffness without adding additional height to the subassembly.

The stacked assembly of the present invention can be fabricated using readily available techniques. The assembly preferably provides electrically conductive pathways connecting the chips in the stack to one another and to external circuit elements with low impedance and short circuit path lengths, while minimizing mechanical stresses caused by differences in thermal expansion between the chip and the dielectric elements. The presence of stiffening layers in one or more of the subassemblies result in a more rigid structure than stacked assemblies formed by techniques presently in use.

Referring to FIG. 8, in accordance with another preferred embodiment of the present invention, a stacked microelectronic assembly 800 includes a first subassembly 810 stacked atop and electrically interconnected with a second subassembly 820. The first subassembly includes a flexible substrate 815 having a first surface 816 and a bottom surface 818 remote therefrom. First subassembly 810 also includes conductive elements 818, such as conductive traces provided over the top surface 816 of flexible substrate 815. First subassembly 810 also includes a microelectronic element 801, such as a semiconductor chip, including a front contact bearing face 802 and back face 803 remote therefrom. During assembly, microelectronic element 801 is mounted above the top surface 816 of flexible substrate 815 with back face 803 facing top surface 816. The microelectronic element 801 is electrically interconnected with conductive element 818 by wire bonds 822. Preferably, wire bonds 822 have first ends 823 attached to contacts (not shown) on front face 802 of microelectronic element 801 and second ends 824 attached to conductive element 818. Pan-out connectors 808, such as high-melting temperature solder balls, are disposed on top surface 816 of flexible substrate 815 and are electrically connected with at least some of the conductive elements 818 extending over top surface 816. The fan-out connectors 808 are preferably located atop the surface 816 of flexible substrate 815 so that when the subassemblies 810, 820 are stacked one atop another, the fan-out connectors 808 electrically interconnect the subassemblies within the stack, thereby acting as vertical conductors. In preferred embodiments, the fan-out connectors 808 extend beyond the outer edges of the microelectronic element 801. In highly preferred embodiments, the fan-out connectors 808 are located adjacent peripheral regions 825 of the flexible substrate 815.

Subassembly 810 also preferably includes a stiffening layer 804 made of an encapsulating material. In preferred embodiments, the stiffening layer 804 is made of an encapsulating material such as flexibilized epoxy or silicone elastomers, which surround both microelectronic element 801 and fan-out connectors 808. The stiffening layer 804 may also encapsulate the wire bonds 822. In certain preferred embodiments, the stiffening layer completely encapsulates the wire bonds 822 and the microelectronic element 801. In other embodiments, however, such as the one shown in FIG. 8, the stiffening layer encapsulates only certain sections of the wire bond 822.

Stacked microelectronic assembly 800 also includes second subassembly 820 having flexible substrate 815', microelectronic element 801', fan-out connectors 808', wire bonds 822' and stiffening layer 804'. In the particular embodiment shown in FIG. 8, second subassembly 820 is substantially similar to first subassembly 810. As with the first subassembly 810, the stiffening layer 804' of second subassembly 820 adds rigidity to the subassembly in the vicinity of the peripheral region 825' of flexible substrate 815'.

Stacked microelectronic assembly 800 also includes one or more joining units 828' provided over second surface 818' of flexible substrate 815'. The joining units 828' are preferably electrically interconnected to at least some of the fan-out connectors 208 and/or microelectronic elements 801, 801'. Joining units 828' are preferably used to attach the stacked microelectronic assembly to an external element, such as a substrate having electrical contacts or pads.

FIG. 9 shows a stacked microelectronic assembly 900, in accordance with another preferred embodiment of the present invention, including first subassembly 910 stacked over second subassembly 920. First subassembly 910 includes substrate 915 having top surface 716 and microelectronic element 901 having back face 903 facing top surface 716. The front fact 902 faces away from top surface 916 and has contacts (not shown) that are electrically interconnected with conductive elements 919 by wire bonds 922. First subassembly 910 includes fan-out connectors 909 at peripheral regions 925 of flexible substrate 915. First subassembly 910 also includes a stiffening layer 904 that extends around microelectronic element 901 and fan-out connectors 909.

Second subassembly 920 includes microelectronic element 901' having a contact bearing front face 902' that faces top surface 916' of flexible substrate 915'. The mounting of the microelectronic element 901' over flexible substrate 915' is commonly referred to as a "flip-chip" assembly. The microelectronic element 901' is electrically interconnected with conductive elements 919' extending over first surface 916' using flexible leads 922'.

FIG. 10 shows a stacked microelectronic assembly 1000 including a first subassembly 1010 stacked over a second subassembly 1020. First subassembly 1010 includes a microelectronic element 1001 having a contact bearing face 1002 facing away from top surface 1016 of flexible substrate 1015. Microelectronic element 1001 is electrically interconnected with conductive elements 1018 by wire bonds 1022. First subassembly 1010 includes fan-out connectors 1008 provided in peripheral regions 1025 of flexible substrate 1015. A stiffening layer 1004 surrounds microelectronic element 1001 and fan-out connectors 1008 for providing stiffening at peripheral regions 1025 of flexible substrate 1015, thereby facilitating testing and handling of the subassembly. The first subassembly 1010 includes a compliant layer disposed between the microelectronic element 1001 and the substrate 1015 to permit relative movement of the microelectronic element and the substrate during thermal cycling of the subassembly. The compliant layer includes a plurality of compliant pads 1030 spaced from one another for defining channels or gaps therebetween. The encapsulant layer or stiffening layer 1004 is disposed in the channels between the compliant pads 1030.

Second subassembly 1020 includes generally similar elements as those described above in first subassembly 1010, however, second subassembly 1020 includes a microelectronic element 1001' that is substantially larger than microelectronic element 1001 of first subassembly 1010.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as described herein. Such changes would include the incorporation of features of the stacked microelectronic assemblies disclosed in U.S. Pat. No. 5,861, 666 or commonly owned U.S. Pat. Nos. 6,121,676 and 6,225, 688 and commonly assigned U.S. patent application Ser. No. 09/776,356, the disclosures of which are incorporated herein by reference.

INDUSTRIAL APPLICABILITY

The present invention has applicability in the microelectronics industry.

The invention claimed is:

1. A microelectronic subassembly comprising:
a dielectric substrate having a top surface being a major surface, the top surface including a first region and at least one peripheral region extending beyond the first region;
a microelectronic element having a major surface confronting the first region of the top surface of the dielectric substrate, the microelectronic element having peripheral edges extending away from the major surfaces;
a plurality of leads electrically connected to the microelectronic element having outer ends overlying the at least one peripheral region of the substrate beyond at least one of the peripheral edges of the microelectronic element;
vertical conductors electrically connected with the outer ends of the leads and projecting upwardly above the at least one peripheral region of the top surface; and
an encapsulant layer provided over the top surface of the substrate and extending continuously from at least the peripheral edges of the microelectronic element to surround the vertical conductors for stiffening the substrate at the at least one peripheral region of the top surface of the substrate, wherein at least one of the vertical conductors projects to a height above a top surface of the encapsulant layer.

2. The subassembly as claimed in claim 1, wherein the dielectric substrate is flexible.

3. The subassembly as claimed in claim 2, wherein the flexible dielectric substrate comprises a polymeric material.

4. The subassembly as claimed in claim 1, wherein the microelectronic element is a semiconductor chip having a front face with contacts and a back face remote therefrom.

5. The subassembly as claimed in claim 4, wherein the front face of the semiconductor chip faces the top surface of the substrate and the leads are connected to the chip contacts.

6. The subassembly as claimed in claim 4, wherein the back face of the semiconductor chip faces the top surface of the substrate, and wherein the subassembly further comprises conductive wires having first ends connected to the chip contacts and second ends connected to the leads.

7. The subassembly as claimed in claim 1, further comprising a compliant layer disposed between the microelectronic element and the substrate so as to permit relative movement of the microelectronic element and the substrate during thermal cycling of the subassembly.

8. The subassembly as claimed in claim 7, wherein the compliant layer comprises a plurality of compliant pads spaced from one another, the spaced compliant pads defining channels therebetween.

9. The subassembly as claimed in claim 8, wherein the stiffening encapsulant layer is disposed in the channels between the compliant pads.

10. The subassembly as claimed in claim 1, wherein the stiffening encapsulant layer is selected from the group consisting of flexibilized epoxies, silicone elastomers, glass sheet, glass-filled epoxy, ceramic materials and plastic.

11. The subassembly as claimed in claim 1, wherein the substrate comprises a plurality of dielectric layers, and wherein a plurality of layers of conductive traces extend through the substrate.

12. The subassembly as claimed in claim 1, wherein the substrate includes a conductive metal layer adapted to function as a power plane.

13. The subassembly as claimed in claim 1, wherein the substrate includes a conductive metal layer adapted to function as a ground plane.

14. The microelectronic subassembly as claimed in claim 1, wherein the vertical conductors comprise solder balls.

15. The microelectronic subassembly as claimed in claim 1, wherein the at least one of the vertical conductors projecting beyond the encapsulant layer has a height that is greater than a height of the encapsulant layer at the at least one peripheral region of the substrate.

16. The subassembly as claimed in claim 1, wherein the vertical conductors have lower ends electrically connected with the outer ends of the leads, mid-sections that extend through the encapsulant layer and upper ends that project from the top surface of the encapsulant layer.

17. A microelectronic subassembly comprising:
a dielectric substrate having a top surface being a major surface, a bottom surface remote from the top surface, the top surface including a first region and at least one peripheral region extending beyond the first region;
a microelectronic element having a major surface confronting the first region of the top surface of the dielectric substrate, the microelectronic element having peripheral edges extending away from the major surface of the microelectronic element;
a plurality of leads electrically connected to the microelectronic element having outer ends overlying the at least one peripheral region of the substrate beyond at least one of the peripheral edges of the microelectronic element;
vertical conductors electrically connected with the outer ends of the leads and projecting upwardly above the at least one peripheral region of the top surface; and
an encapsulant layer provided over one of the surfaces of the substrate and extending continuously from at least the peripheral edges of the microelectronic element to surround the vertical conductors for stiffening the substrate at the at least one peripheral region of the top surface of the substrate, wherein the encapsulant layer has at least one edge at the least one peripheral region of the substrate and a top surface that extends from the at least one edge toward the microelectronic element, and wherein at least one of the vertical conductors is accessible at the top surface of the encapsulant layer.

18. The subassembly as claimed in claim 17, wherein the vertical conductors are disposed over the bottom surface of the substrate.

19. The microelectronic subassembly as claimed in claim 17, wherein the vertical conductors comprise solder balls.

20. The microelectronic subassembly as claimed in claim 17, wherein the at least one of the vertical conductors accessible at an exterior surface of the encapsulant layer has a height that is greater than a height of the encapsulant layer at the at least one peripheral region of the substrate.

21. The subassembly as claimed in claim 17, wherein the vertical conductors have lower ends electrically connected with the outer ends of the leads, mid-sections that extend through the encapsulant layer and upper ends that project from the top surface of the encapsulant layer.

22. A microelectronic assembly including a plurality of microelectronic subassemblies, each subassembly comprising:
a substrate having a top surface being a major surface, the top surface including a first region and at least one peripheral region extending beyond the first region;
a microelectronic element having a major surface confronting the first region of the top surface of the dielectric substrate, the microelectronic element having peripheral edges extending away from the major surface of the microelectronic element;
a plurality of leads electrically connected to the microelectronic element having outer ends overlying the at least one peripheral region of the substrate beyond at least one of the peripheral edges of the microelectronic element;
vertical conductors electrically connected with the outer ends of the leads and projecting upwardly above the at least one peripheral region of the top surface; and
an encapsulant layer provided over a surface of the substrate and extending continuously from at least the peripheral edges of the microelectronic element to surround the vertical conductors for stiffening the substrate at the at least one peripheral region of the top surface of the substrate, wherein the vertical conductors at the at least one peripheral region of the top surface project above a top surface of the encapsulant layer and wherein the microelectronic subassemblies are stacked one a top another and electrically connected through the vertical conductors.

23. The microelectronic assembly as claimed in claim 22, wherein the microelectronic element is a semiconductor chip having a front face with contacts and a back face remote therefrom.

24. The microelectronic assembly as claimed in claim 23, wherein the front face of the semiconductor chip faces a top surface of the substrate and the leads are connected to the chip contacts.

25. The microelectronic assembly as claimed in claim 23, wherein the back face of the semiconductor chip faces a top surface of the substrate and wherein the subassembly further comprises conductive wires having first ends connected to the chip contacts and second ends connected to the leads.

26. The microelectronic assembly as claimed in claim 22, further comprising a compliant layer disposed between the microelectronic element and the substrate so as to permit relative movement of the microelectronic element and the substrate during thermal cycling of the subassembly.

27. The microelectronic assembly as claimed in claim 26, wherein the compliant layer comprises a plurality of compliant pads spaced from one another for defining channels therebetween.

28. The microelectronic assembly as claimed in claim 27, wherein the stiffening encapsulant layer is disposed in the channels between the compliant pads.

29. The microelectronic assembly as claimed in claim 22, wherein the vertical conductors comprise metallic masses.

30. The microelectronic assembly as claimed in claim 29, wherein each of the substrates has a central region aligned with the microelectronic element mounted to such flexible substrate and a plurality of peripheral regions extending outwardly at a plurality of edges of each of the substrates.

31. The microelectronic assembly as claimed in claim 22, wherein the substrates are flexible dielectric substrates.

32. The microelectronic assembly as claimed in claim 22, wherein the stiffening encapsulant layer is provided around outer edges of the microelectronic element.

33. The microelectronic assembly as claimed in claim 22, wherein the vertical conductors comprise solder balls.

34. The microelectronic assembly as claimed in claim 22, wherein the vertical conductors at the at least one peripheral region of the substrate have a height that is greater than a height of the encapsulant layer at the at least one peripheral region of the substrate.

35. The microelectronic assembly as claimed in claim 22, wherein the vertical conductors form interconnections between leads of different subassemblies.

36. The assembly as claimed in claim 22, wherein the vertical conductors have lower ends electrically connected with the outer ends of the leads, mid-sections that extend through the encapsulant layer and upper ends that project from the top surface of the encapsulant layer.

* * * * *

UNITED STATES PATENT AND TRADEMARK OFFICE
CERTIFICATE OF CORRECTION

| | | |
|---|---|---|
| PATENT NO. | : 7,605,479 B2 | Page 1 of 1 |
| APPLICATION NO. | : 10/487482 | |
| DATED | : October 20, 2009 | |
| INVENTOR(S) | : Ilyas Mohammed | |

It is certified that error appears in the above-identified patent and that said Letters Patent is hereby corrected as shown below:

Column 12, line 62, "a top" should read --atop--.

Signed and Sealed this

Twenty-third Day of November, 2010

David J. Kappos
*Director of the United States Patent and Trademark Office*